United States Patent [19]

Wong et al.

[11] 4,210,829

[45] Jul. 1, 1980

[54] POWER UP CIRCUIT WITH HIGH NOISE IMMUNITY

[75] Inventors: Thomas S. W. Wong, San Francisco; Wing Y. Wong; Edwin M. W. Chow, both of Sunnyvale, all of Calif.

[73] Assignee: National Semiconductor Corporation, Santa Clara, Calif.

[21] Appl. No.: 947,521

[22] Filed: Oct. 2, 1978

[51] Int. Cl.$^2$ .................... H03K 17/60; H03K 5/08
[52] U.S. Cl. ................... 307/296 R; 307/237; 307/251; 307/297
[58] Field of Search ............ 307/296, 297, 254, 251, 307/237, 268, 208

[56] References Cited

U.S. PATENT DOCUMENTS

| | | | |
|---|---|---|---|
| 3,774,053 | 11/1973 | Carlson | 307/237 |
| 3,895,239 | 7/1975 | Alaspa | 307/268 |
| 3,904,975 | 9/1975 | Satoh | 307/237 |
| 3,950,654 | 4/1976 | Broedner et al. | 307/297 |

Primary Examiner—Stanley D. Miller, Jr.
Assistant Examiner—B. P. Davis
Attorney, Agent, or Firm—Gail W. Woodward; James A. Sheridan

[57] ABSTRACT

A power up circuit for an associated digital circuit is disclosed which prevents noise from falsely resetting the associated digital circuit after completion of the powering up function. The power up circuit has a series connection of a first capacitor and a high impedance coupled between the power supply and ground. The high impedance is connected in parallel with the source and drain electrodes of an enhancement type field effect transistor. The node of the high impedance and the first capacitor is connected to an inverting amplifier which produces an inverted output after the input signal falls to a threshold potential. The output of the inverting amplifier is connected to the gate of the field effect transistor and to a second capacitor which is connected to ground. The output of the inverting amplifier is applied to the reset line of the associated digital circuit to cause resetting of the digital circuit upon the connection of the power supply to the digital circuit. After powering up, the field effect transistor is biased on by the output of the inverting amplifier. Any noise pulses which are coupled to the first capacitor are shunted to ground by the low impedance of the turned on field effect transistor.

8 Claims, 2 Drawing Figures

POWER UP CIRCUIT WITH HIGH NOISE IMMUNITY

BACKGROUND OF THE INVENTION

The invention relates to noise immune power up circuits for use in resetting an associated digital circuit upon connection of the power supply to the digital circuit.

DESCRIPTION OF THE PRIOR ART

Power up circuits are used for automatically resetting logic circuits contained within a digital circuit when the power supply is connected to the digital circuit. Without a power-up circuit, the connection of the power supply to the digital circuit would result in the logic circuits being in an undefined state which would prevent proper circuit operation. Power-up circuits are conventionally used in digital systems, such as digital watches, which do not have external resets.

FIG. 1 illustrates the prior art power up circuit. The circuit 10 consists of a series connection of a capacitor 12 connected in series with a high impedance 14. One terminal of the capacitor 12 is connected to the drain supply $V_{DD}$. One terminal of the high impedance 14 is coupled to ground. The node 16 of the capacitor 12 and high impedance 14 is coupled to an inverting amplifier 18. The capacitor 12 and high impedance 14 function as a differentiation circuit at node 16.

Upon powering up, which occurs when a DC potential produced by a power supply such as a battery is connected to a digital circuit, the power supply potential $V_{DD}$ is applied to the capacitor 12. Thereupon the series connection of capacitor 12 and high impedance 14 causes a pulse to be developed at node 16 which falls exponentially with a time constant determined by RC. The pulse is amplified and inverted by inverting amplifier 18. The output pulse produced by circuit 18 is connected to the reset line of an associated digital circuit not shown for reasons of clarity.

The foregoing power up circuit has the disadvantage in that it does not prevent the coupling of noise pulses from power lines or other sources to the reset line of the associated digital circuitry which could cause false resets of the digital circuit. In this circuit, noise pulses which are coupled to the capacitor 12 will be applied to the reset line.

SUMMARY OF THE INVENTION

A power up circuit in accordance with the present invention prevents the application of noise pulses to the reset line of an associated digital circuit after powering up has been completed.

The power up circuit of this invention includes a series connection of a first capacitor and a high impedance between the power supply potential and ground. The high impedance is connected in parallel with the source and drain electrodes of an enhancement type field effect transistor. The node of the first capacitor and the high impedance is connected to an inverting amplifier which produces an inverted output pulse once the magnitude of the input signal to the amplifier falls to a threshold. The inverted output of the inverting amplifier is applied to the gate of the field effect transistor and to a second capacitor which is connected to ground. The output of the inverting amplifier is coupled to the reset line of the associated digital circuit.

DESCRIPTION OF THE PREFERRED EMBODIMENT

Figure 1:
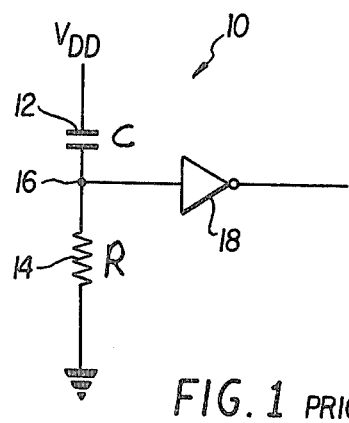
FIG. 1 is a schematic of the prior art powering up circuit.
Figure 2:
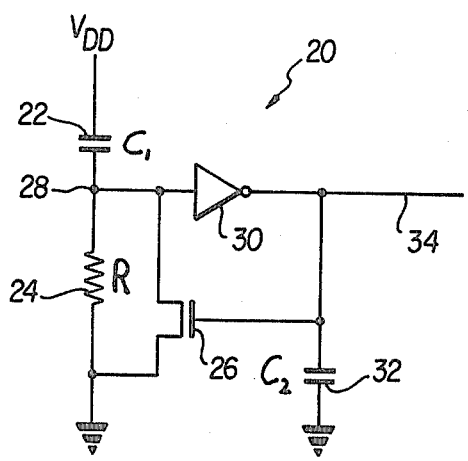
FIG. 2 is a schematic of a power up circuit in accordance with the invention.

FIG. 2 illustrates a power up circuit 20 in accordance with the present invention. A series connection of a first capacitor 22 and a high impedance 24 is connected between the power supply potential $V_{DD}$ and ground. The high impedance 24 is connected in parallel with the source and drain electrodes of an enhancement type field effect transistor 26. The node 28 of the first capacitor 22 and high impedance 24 is connected to the input of an inverting amplifier 30 which produces an inverted output once the magnitude of the input signal falls to a threshold potential. The first capacitor 22 and high impedance 24 function as a differentiation circuit at node 28. The threshold potential is not critical and is chosen to be a small percentage of the power supply potential $V_{DD}$. The output of inverting amplifier 30 is connected to the gate of the field effect transistor 26 and to a second capacitor 32 which is connected to ground. The output of the amplifier is also connected to the reset line 34 of an associated digital circuit which is not shown for reasons of clarity.

The present invention is used by the assignee National Semiconductor Corporation in digital watches identified by model numbers MM48300, MM48184 and MM48181. An inverting amplifier 30 in accordance with the foregoing description is used in the above identified digital watches.

In the foregoing watch models, the capacitor 22 is approximately 5 picofarads, the second capacitor 32 is approximately 2.5 picofarads; high impedance 24 is 10–20 megohms and the gain of inverting amplifier 30 is approximately 100.

In the foregoing digital watches, the powering up circuit of the invention is implemented as an integrated circuit. The fabrication of an integrated circuit implementing the present invention is within the skill in the art and is in itself not part of the present invention.

The operation of the present invention is as follows. Initially, upon the application of the power supply potential $V_{DD}$ to capacitor 22, a pulse is produced at node 28 which falls exponentially with a time constant by $RC_1$. The pulse is amplified and inverted by inverting amplifier 30 after the input pulse falls to the threshold potential of amplifier 30. Initially amplifier 30 produces a grounded output which rapidly jumps to a saturated high output after the input pulse falls below the threshold potential. During the grounded output state, amplifier 30 activates the reset circuit of an associated digital circuit (not illustrated) which is coupled to reset line 34. The capacitor 32 starts to charge as soon as the amplifier 30 produces an output pulse. Field effect transistor 26 starts to conduct as soon as the capacitor 32 charges to the threshold potential of field effect transistor 26. Positive feedback exists between the output and input of amplifier 30. Therefore, as soon as amplifier 30 conducts, it is rapidly driven to saturation, which causes the field effect transistor 26 to be held in conduction by the potential stored on capacitor 32. The latching of the field effect transistor 26 in the "on" condition insures that the high impedance 24 is shunted to ground after powering up is completed which prevents noise pulses from being coupled to reset line 34 from capacitor 22.

While the foregoing invention has been described in terms of a preferred embodiment, it is not intended that the invention be limited to the foregoing preferred embodiment. For example, the circuit parameters used in the commercial implementation of the invention may be modified without departing from the spirit and scope of the invention. The invention may be used as a reset circuit for any circuit which does not have an external reset.

We claim:

1. In a power up circuit for resetting an associated digital circuit upon the application of a power supply potential to the digital circuit which includes a series connection of a capacitor and an impedance which is connected between the power supply potential and a reference potential and an inverting amplifier having an input coupled to the node of the capacitor and the impedance and an output which is coupled to a reset line of the digital circuit, the improvement comprising:
   (a) a transistor having a control electrode and two additional electrodes, the two additional electrodes being coupled in parallel with the impedance, the control electrode being coupled to the output of the inverting amplifier; and
   (b) a second capacitor having two terminals, the first terminal being coupled to the output of the inverting amplifier and the second terminal being coupled to the reference potential.

2. The power up circuit of claim 1 wherein the transistor is a field effect transistor and the inverting amplifier has an input threshold potential below which the input signal must fall before an inverted output signal is produced.

3. The power up circuit of claim 2 wherein the reference potential is ground.

4. The power up circuit of claim 3 wherein the gain of the inverting amplifier is approximately 100, the first capacitor is approximately 5 picofarads, the second capacitor is approximately 2.5 picofarads and the impedance is between 10 and 20 megohms.

5. A noise immune power up circuit comprising:
   (a) a series connection of a first capacitor and an impedance coupled between a power supply potential and a reference potential;
   (b) an inverting amplifier having an input terminal coupled to a node between the first capacitor and the impedance and an output terminal, the amplifier having the characteristics that an inverted output signal is produced only after the input signal falls below a threshold potential;
   (c) a transistor having two electrodes coupled in parallel with the impedance and a control terminal coupled to the output of the inverting amplifier; and
   (d) a second capacitor having a first terminal coupled to the output of the inverting amplifier and a second terminal coupled to the reference potential.

6. The power up circuit of claim 5 wherein the transistor is a field effect transistor.

7. The power up circuit of claim 6 wherein the capacitance of the first capacitor is approximately twice as large as the capacitance of the second capacitor.

8. The power up circuit of claim 7 wherein the first capacitor is approximately 5 picofarads, the second capacitor is approximately 2.5 picofarads, the impedance is approximately 10–20 megohms and the inverting amplifier has a gain of approximately 100.

* * * * *